(12) United States Patent
Nallani et al.

(10) Patent No.: US 10,355,655 B2
(45) Date of Patent: Jul. 16, 2019

(54) TRANSIMPEDANCE AMPLIFIER (TIA) CIRCUIT HAVING REDUCED POWER CONSUMPTION, IMPROVED LINEARIZATION AND REDUCED PEAKING

(71) Applicant: Avago Technologies International Sales Pte. Limited, Singapore (SG)

(72) Inventors: Chakravartula Nallani, San Jose, CA (US); Georgios Asmanis, Lake Forrest, CA (US); Faouzi Chaahoub, San Jose, CA (US); Alfred Sargezisardrud, San Jose, CA (US); Tony Shuo-Chun Kao, San Jose, CA (US)

(73) Assignee: Avago Technologies International Sales Pte. Limited (SG)

( * ) Notice: Subject to any disclaimer, the term of this patent is extended or adjusted under 35 U.S.C. 154(b) by 80 days.

(21) Appl. No.: 15/638,335

(22) Filed: Jun. 29, 2017

(65) Prior Publication Data
US 2019/0020320 A1    Jan. 17, 2019

(51) Int. Cl.
    H03F 3/08    (2006.01)
    H03F 3/45    (2006.01)
    H03F 1/32    (2006.01)

(52) U.S. Cl.
    CPC ....... *H03F 3/45179* (2013.01); *H03F 1/3211* (2013.01); *H03F 3/4508* (2013.01); *H03F 3/45475* (2013.01); *H03F 2203/45586* (2013.01)

(58) Field of Classification Search
    CPC .................................................... H03F 3/08
    USPC ...................................... 330/308; 250/214 A
    See application file for complete search history.

(56) References Cited

U.S. PATENT DOCUMENTS

| | | | |
|---|---|---|---|
| 6,559,786 B2 * | 5/2003 | Groiss | G01R 19/25 341/118 |
| 8,970,300 B2 | 3/2015 | Piepenstock et al. | |
| 2006/0109057 A1 * | 5/2006 | Kikuchi | H03F 3/087 330/308 |
| 2006/0202766 A1 * | 9/2006 | Kwa | H03F 1/08 330/308 |
| 2006/0226913 A1 * | 10/2006 | Nogami | H03F 3/08 330/308 |
| 2010/0045387 A1 * | 2/2010 | Ohta | H03F 3/082 330/308 |
| 2012/0032722 A1 | 2/2012 | Mulder | |
| 2016/0142028 A1 | 5/2016 | Kim et al. | |

* cited by examiner

*Primary Examiner* — Henry Choe
(74) *Attorney, Agent, or Firm* — Sheridan Ross P.C.

(57) ABSTRACT

A TIA circuit is provided that utilizes current steering to adjust the gain of a TIA of the TIA circuit. As the optical input power of the optoelectronic (OE) detector that is coupled to the input of the TIA increases, the gain of the TIA is decreased via current steering, and as the optical input power of the OE detector decreases, the gain of the TIA is increased via current steering. Utilizing current steering to adjust the gain of the TIA allows the TIA circuit to have a configuration that has reduced power consumption compared to TIA circuits that use shunt feedback TIAs. In addition the TIA circuit configuration provides reduced peaking, improved linearization and high bandwidth.

20 Claims, 11 Drawing Sheets

TRANSIMPEDANCE AMPLIFIER (TIA) CIRCUIT HAVING REDUCED POWER CONSUMPTION, IMPROVED LINEARIZATION AND REDUCED PEAKING

TECHNICAL FIELD OF THE INVENTION

The invention relates to transimpedance amplifier (TIA) circuits for use in optical receivers. More particularly, the invention relates to a TIA circuit for use in optical receivers that has reduced power consumption, improved linearization and reduced peaking.

BACKGROUND OF THE INVENTION

A typical optical receiver (Rx) includes at least one optoelectronic (OE) detector that detects an optical signal and converts it into an electrical current signal and at least one transimpedance amplifier (TIA) that converts the electrical current signal into an electrical voltage signal. The OE detector, which is typically a P-intrinsic-N(PIN) photodiode, produces an electrical current signal in response to light detected by it. The TIA converts this electrical current signal into an output voltage signal having some gain, commonly referred to as transimpedance gain. This output voltage signal is further processed by other circuitry of the optical Rx (e.g., a limiting amplifier (LA), clock and data recover (CDR), etc.) to recover the data signal.

In order to reduce power consumption and increase data handling capacity per channel, modern optical communication systems often have multiple single-ended Rx channels. Typically, each optical receiver (Rx) channel has a TIA circuit at its analog front-end (AFE) that converts the current signal output from the PIN photodiode into a voltage signal. The PIN photodiode capacitance at the input of the TIA circuit contributes significantly to the bandwidth of the TIA circuit. Current optical communication systems transmit data at rates of, for example, 400 gigabits per second (Gbps) or higher and have multiple Rx channels receiving, for example, 28 Gbps per channel. Hence, the TIA circuit used in such optical RXs requires more than 20 GHz to 25 GHz of bandwidth. A large PIN photodiode capacitance at the input of the TIA circuit reduces the bandwidth of the TIA circuit and therefore reduces the Rx data rate. Also, any peaking in the frequency response of the TIA circuit leads to overshoots in the transient waveform of the TIA circuit, which leads to eye closure.

Nonlinearity of the TIA circuit is also of great importance because it leads to in-band distortion components. Moreover, modern optical data transmission systems that use complex modulation schemes such as Pulse Amplitude Modulation (PAM)-4, for example, require a high level separation mismatch ratio (RLM), which is the performance metric used to quantify the linearity in a PAM-4 data eye diagram. A lower RLM value means that the amplitude of the signal being inputted into the blocks father down in the TIA chain is reduced, which results in bit errors that are not acceptable in many optical communication links.

A typical TIA circuit is shown in FIG. 1. The TIA circuit 100 includes a TIA 102, a variable feedback impedance 103 connected between an output terminal of the TIA 102 and the inverting input terminal of the TIA 102, a variable gain control amplifier (VGA) circuit 104 having an input terminal that is connected to the output terminal of the TIA 102, an output driver 105 having an input terminal that is connected to an output terminal of the VGA circuit 104, a DC offset cancellation circuit 106, and an automatic gain control (AGC) circuit 107.

A PIN photodiode 108, which is external to the TIA circuit 100, has an anode that is connected to the inverting terminal of the TIA 102 and a cathode that is connected to a Received Signal Strength Indicator (RSSI) circuit 109 and to a PIN supply voltage, $V_{PIN}$. The RSSI circuit 109 is also external to the TIA circuit 100. The RSSI circuit 109 outputs an indicator signal, RSSI, which is indicative of the optical power level of the incident light striking the PIN photodiode 108. The RSSI signal is used to produce a voltage signal, $V_{RF}$, which, in turn, is used to vary a variable impedance of the TIA 102, which is typically an operational amplifier (Op Amp). For ease of illustration, the variable impedance 103 of the TIA 102 is represented by a feedback resistor. The circuitry that is used to convert the RSSI signal into the voltage signal $V_{RF}$ is not shown.

The AGC circuit 107 receives the signals that are outputted from the VGA circuit 104 and the output driver 105 and uses them to obtain feedback signals that it then uses to adjust the gain of the amplifier stages of the VGA circuit 104 and the gain of the output driver 105. The DC cancellation circuit 106 receives the signals that are outputted from the TIA 102, the VGA circuit 104 and the output driver 105 and use them to control the gate of an N-type metal oxide semiconductor field effect transistor (NMOS) 101 and to adjust the gain of the amplifier stages of the VGA circuit 104 and of the output driver 105. The DC offset cancellation circuit 106 controls the NMOS 101 to adjust an amount of DC offset that is added to the input signal of the TIA 102.

The TIA 102 is typically a shunt feedback TIA that adjusts the variable feedback impedance 103 based on the average optical power detected by the RSSI circuit 109. One of the drawbacks of the shunt feedback TIA is that it consumes a relatively large amount of power. Another drawback is that in order to maintain the operations of the shunt feedback TIA in the linear region, the gain of the first amplifier stage $104_1$ of the VGA circuit 104 has to be reduced as the input optical power of the PIN photodiode 108 increases, which can result in peaking that can reduce the eye opening of the eye diagram. As indicated above, peaking is particularly problematic when complex modulation schemes, such as PAM-4, for example, are used because it degrades optical link quality, which leads to bit errors.

Accordingly, a need exists for a TIA circuit having a high bandwidth, reduced power consumption, improved linearization and reduced peaking.

DETAILED DESCRIPTION

Figure 1:
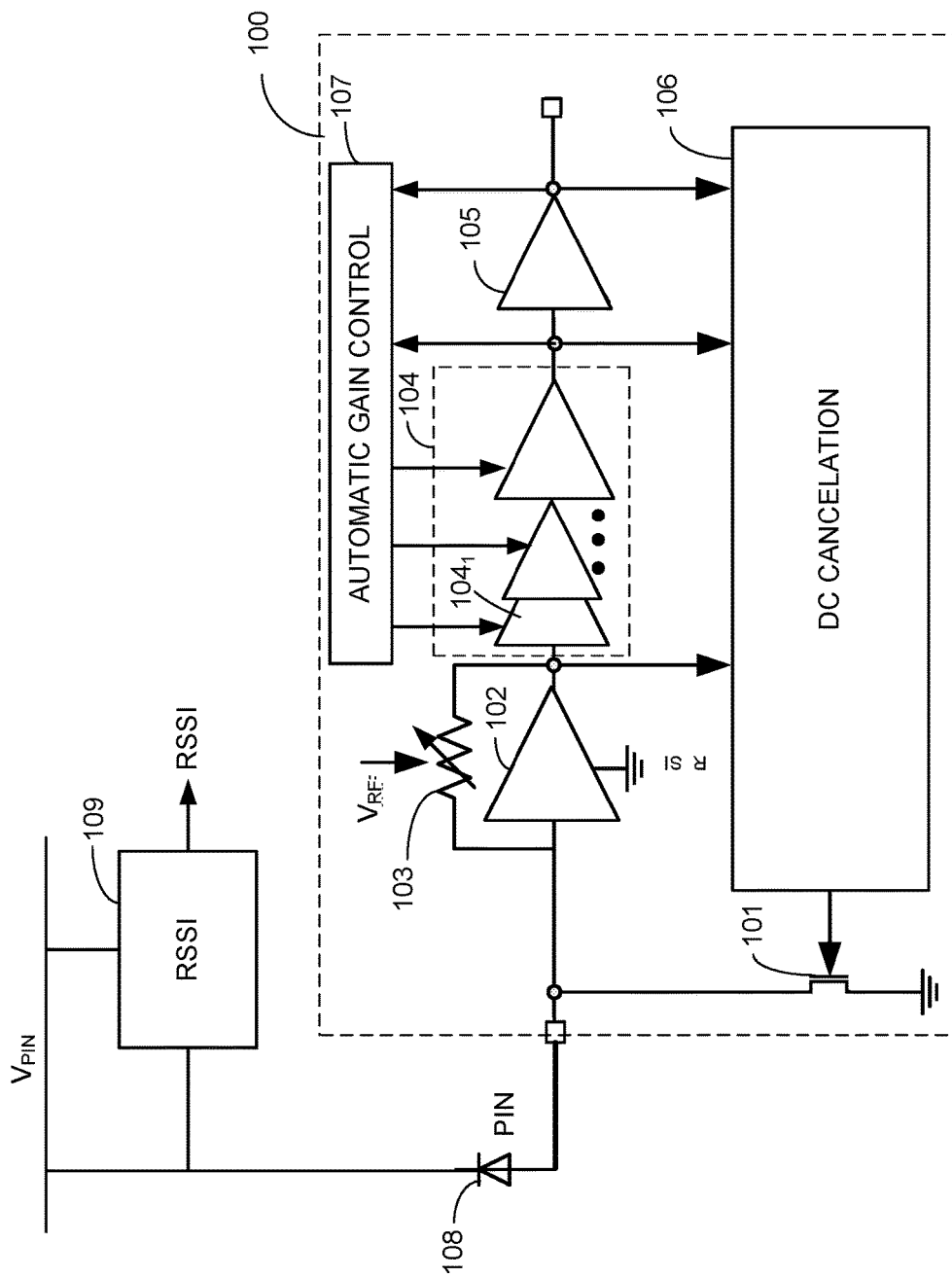
FIG. 1 illustrates a block diagram of a known TIA circuit having a typical configuration.

In accordance with illustrative embodiments, a TIA circuit is provided that utilizes current steering to adjust the gain of a TIA of the TIA circuit. As the optical input power of the OE detector that is coupled to the input of the TIA increases, the gain of the TIA is decreased via current steering, and as the optical input power of the OE detector decreases, the gain of the TIA is increased via current steering. Utilizing current steering to adjust the gain of the TIA allows the TIA circuit to have a configuration that has reduced power consumption compared to TIA circuits that use shunt feedback TIAs. In addition the TIA circuit configuration provides reduced peaking, improved linearization and high bandwidth.

A few illustrative embodiments of the offset measurement and cancellation circuitry and method will now be described with reference to the FIGS. 1-11, in which like reference numerals represent like elements, features or components.

As used in the specification and appended claims, the terms "a," "an," and "the" include both singular and plural referents, unless the context clearly dictates otherwise. Thus, for example, "a device" includes one device and plural devices.

It should be noted that when an element is referred to herein as being "connected to" or "coupled to" or "electrically coupled to" another element, it can be directly connected or coupled, or intervening elements may be present.

Figure 2:
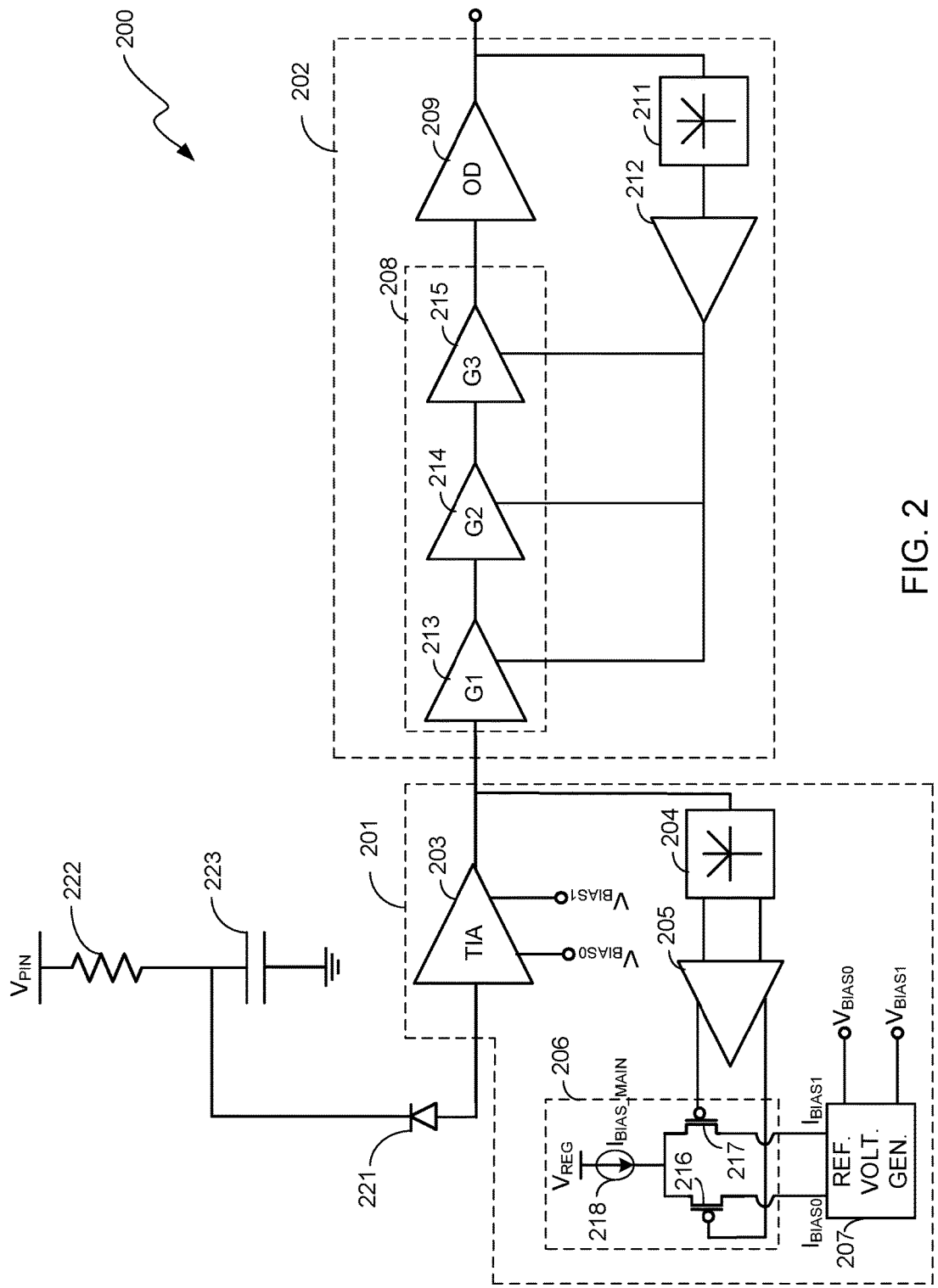
FIG. 2 illustrates a block diagram of a TIA circuit in accordance with a representative embodiment.

FIG. 2 illustrates a block diagram of a TIA circuit 200 in accordance with a representative embodiment. The TIA circuit 200 has a first feedback loop 201 and a second feedback loop 202. The first feedback loop 201 comprises a TIA 203, a first peak detector 204, a first differential operational amplifier (Op Amp) 205, a reference current generator circuit 206, and a reference voltage generator circuit 207. The outputs, $V_{BIAS0}$ and $V_{BIAS1}$, of the reference voltage generator circuit 207 are fed back as feedback signals to the TIA 203. The second feedback loop 202 comprises a VGA circuit 208 having an input terminal that is connected to the output terminal of the TIA 203, an output driver 209 having an input terminal that is connected to an output terminal of the VGA circuit 208, a second peak detector 211 having an input terminal that is connected to an output terminal of the output driver 209, and a second differential Op Amp 212 having an input terminal that is connected to an output terminal of the second peak detector 211. The output of the second differential Op Amp 212 is fed back as a feedback signal to first, second and third gain stages, G1 213, G2 214 and G3 215, respectively, of the VGA circuit 208.

An OE detector 221, which is external to the TIA circuit 200, is connected to the input of the TIA 203. The OE detector 221, which is typically a PIN photodiode, has an anode that is connected to the input of the TIA 203 and a cathode that is connected to first terminals of a resistor 222 and a capacitor 223, which are connected together. The second terminal of the resistor 222 is connected to the supply voltage, $V_{PIN}$, of the OE detector 221. The second terminal of the capacitor 223 is connected to ground. All of the components shown in the FIG. 2 except for the OE detector 221 are typically integrated on a TIA integrated circuit (IC) chip (not shown). Such a TIA IC chip may contain additional components that are not shown in FIG. 2 or described herein in the interest of brevity and for ease of illustration. For example, the TIA IC chip may also include an RSSI circuit and a DC offset cancellation circuit.

When optical power is incident on the OE detector 221, a current signal is generated by the OE detector 221 that flows into the input of the TIA 203. The TIA 203 converts the current signal into a voltage signal that is output from the TIA 203 with some amplification, or gain. The amplified voltage signal is amplified by the gain stages G1 213, G2 214 and G3 215 and input to the output driver 209, which further amplifies the voltage signal to produce an output voltage signal of the TIA circuit 200, which is typically connected to a 50 Ohm (Q) load termination (not shown).

To ensure that the output voltage signal of the TIA circuit 200 is not distorted, all of the gain stages G1 213, G2 214 and G3 215 operate in linear fashion. The first and second feedback loops 201 and 202, respectively, achieve this goal. The first feedback loop 201 senses the voltage signal at the output of the TIA 203, feeds it to first peak detector 204, which detects the peak-to-peak amplitude of the signal, compares it to a reference voltage and outputs the comparison results to the first differential Op Amp 205. The first differential Op Amp 205 senses the comparison results and generates appropriate first and second correction signals at its output, which are provided to the reference current generator circuit 206 comprising first and second P-type metal oxide semiconductor field effect transistor (PMOSs) 216 and 217, respectively, comprising a differential PMOS pair and a current source 218. The current source 218 is connected to the source of the PMOSs 216 and 217 and the first and second correction signals are received at the gates of the PMOSs 216 and 217, respectively. The drains of the PMOSs 216 and 217 are connected to first and second input terminals, respectively, of the reference voltage generator circuit 207.

First and second bias current signals, $I_{BIAS0}$ and $I_{BIAS1}$, respectively, have magnitudes that vary based on the values of the first and second correction signals, respectively, that are applied to the gates of the first and second PMOSs 216 and 217, respectively. The reference voltage generator circuit 207 receives the first and second bias current signals $I_{BIAS0}$ and $I_{BIAS1}$, respectively, and converts them into first and second bias voltage signals, $V_{BIAS0}$ and $V_{BIAS1}$, respectively. The first and second bias voltage signals $V_{BIAS0}$ and $V_{BIAS1}$ are feedback signals that are fed back to the TIA 203 and cause the gain of the TIA 203 to be adjusted. Thus, the components 203, 204, 205, 206 and 207 of the first feedback loop 201 comprise AGC circuitry of the TIA circuit 200.

As will be described below in more detail, in contrast to the known shunt TIA described above, which uses a feedback signal to adjust a variable impedance of the shunt TIA, and which consumes a relatively large amount of power, the TIA 203 varies the manner in which current is steered through circuitry of the TIA 203 based on the first and second bias voltage signals $V_{BIAS0}$ and $V_{BIAS1}$, respectively, in order to vary the gain of the TIA 203. The TIA 203 has reduced power consumption compared to the typical shunt TIA configuration. In addition, the ability to adjust the gain of the TIA 203 via current steering enables the downstream gain stages G1 213, G2 214 and G3 215 to operate with improved linearity and reduced peaking.

The second feedback loop 202 is similar in nature to the first feedback loop 201. The peak-to-peak amplitude signal output from the output driver 209 is fed to the second peak detector 211, which detects the peak-to-peak amplitude and outputs the detected peak-to-peak amplitude signal to the second differential Op Amp 212. The second differential Op Amp 212 compares this peak-to-peak amplitude signal to a reference voltage and generates a control voltage signal that is fed back to the gain stages G1 213, G2 214 and G3 215. The control voltage signal adjusts the gain of the gain stages G1 213, G2 214 and G3 215 such that the peak-to-peak amplitude signal output from the output driver 209 is maintained at a desired, or proper, level, which further ensures that the gain stages G1 213, G2 214 and G3 215 operate with linearity. In other words, this ensures that the swing of the peak-to-peak amplitude signal output from the output driver 209 does not become so large that it becomes saturated or so small that the swing is not enough for the subsequent stages, thus allowing optimum eye opening and proper operation of the optical link.

Figure 3:
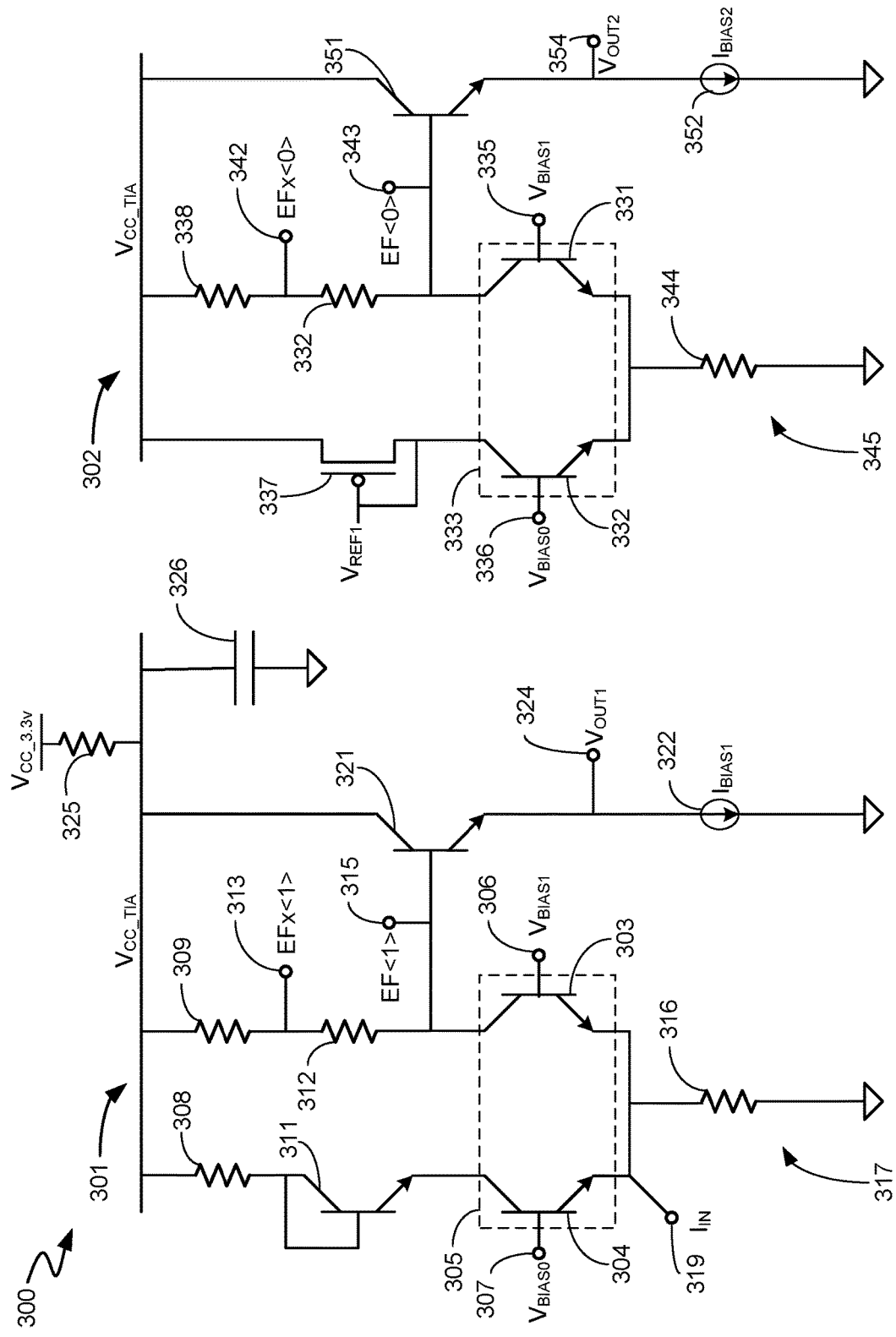
FIG. 3 illustrates a block diagram of a differential amplifier circuit of the TIA shown in FIG. 2 in accordance with a representative embodiment in which the differential amplifier circuit has a single input-to-differential output configuration.

FIG. 3 illustrates a block diagram of a differential amplifier circuit 300 of the TIA 203 shown in FIG. 2 in accordance with a representative embodiment in which the differential amplifier circuit 300 has a single input-to-differential output configuration. It should be noted that in other embodiments, the differential amplifier circuit in accordance with the inventive principles and concepts may have a single input-to-single output configuration or a differential input-to-differential output configuration. Persons of skill in the art will understand the manner in which such configurations can be achieved in view of the embodiments, principles and concepts described herein. Therefore, in the interest of brevity, only a differential amplifier circuit having a single input-to-differential output configuration will be explicitly described herein.

The differential amplifier circuit 300 has a first differential amplifier stage 301 and a dummy, or replica, stage 302, which is needed to achieve the single input-to-differential output configuration. In the first differential amplifier stage 301, transistors 303 and 304 comprise a first differential amplifier 305 having first input terminals 306 and 307 that receive a pair of feedback signals that are generated by the first feedback loop 201 shown in FIG. 2, which is described below in detail. In accordance with this representative embodiment, the transistors 303 and 304 are bipolar junction transistors (BJTs). In accordance with this representative embodiment, the pair of feedback signals comprises first and second bias voltage signals, $V_{BIAS0}$ and $V_{BIAS1}$, respectively. Representative embodiments of the bias current generator circuit 206 and the reference voltage generator circuit 207 shown in FIG. 2 that are used to generate the pair of feedback signals are described below in detail.

The differential amplifier stage 301 has resistors 308 and 309 that have first terminals that are connected to a supply voltage $V_{CC\_TIA}$ and second terminals that are connected to a collector terminal of a BJT 311 and to a first terminal of a resistor 312, respectively. The collector terminal and the base terminal of the BJT 311 are connected together such that the BJT 311 operates as a diode. A first upper compensation current receiving terminal EFx<1> 313 for receiving a first upper compensation current signal is connected to the second and first terminals, respectively, of the resistors 309 and 312, respectively. A first lower compensation current receiving terminal EF<1> 315 for receiving a first lower compensation current signal is connected to a second terminal and to a collector terminal, respectively, of the resistor $R_{L1}$ 312 and of the BJT 303, respectively. Emitters of the BJTs 303 and 304 are connected a first terminal of a resistor 316 of a first tail current branch 317. A second terminal of the resistor $R_{TAIL1}$ 316 is connected to ground. An input current terminal 319 is connected to the emitters of BJTs 303 and 304 and to the first tail current branch 317.

The first lower compensation current receiving terminal EF<1> 315 is connected to the base terminal of a BJT 321 having an emitter terminal that is connected to a first terminal of a first current source 322 and having a collector terminal that is connected to the supply voltage $V_{CC\_TIA}$. A first voltage output terminal 324 is connected to the emitter terminal of the BJT 321 and to the first terminal of the first current source 322. A second terminal of the first current source 322 is connected to ground. A resistor 325 has a first terminal that is connected to a supply voltage $V_{CC\_3.3v}$, and a second terminal that is connected to the supply voltage $V_{CC\_TIA}$. A capacitor 326 has a first terminal that is connected to the supply voltage $V_{CC\_TIA}$ and a second terminal that is connected to ground. The supply voltage $V_{CC\_TIA}$ is generated from the supply voltage $V_{CC\_3.3v}$. The supply voltage $V_{CC\_3.3v}$ is a 3.3 volt (v) supply voltage and the supply voltage $V_{CC\_TIA}$ is also a 3.3 v supply voltage that is generated from the supply voltage $V_{CC\_3.3v}$. The RC circuit comprising the resistor 325 and the capacitor 326 acts as a filter that filters out noise from the supply voltage $V_{CC\_3.3v}$.

In the replica stage 302, BJTs 331 and 332 comprise a second differential amplifier 333 having second input terminals 335 and 336 that receive the pair of feedback signals $V_{BIAS1}$ and $V_{BIAS0}$, respectively, that are generated by the first feedback loop 201 shown in FIG. 2. The replica stage 301 has a PMOS 337 and a resistor 338 that have a source terminal and a first terminal, respectively, that are connected to the supply voltage $V_{CC\_TIA}$ and that have a drain terminal and a second terminal, respectively, that are connected to a collector terminal of the BJT 332 and to a first terminal of a resistor 332, respectively. The resistor 332 has a first terminal that is connected to the supply voltage $V_{CC\_TIA}$ and a second terminal that is connected to the collector terminal of BJT 331. The gate and the drain of the PMOS 337 are connected together. A second upper compensation current receiving terminal EFx<0> 342 for receiving a second upper compensation current signal is connected to the second and first terminals, respectively, of the resistors 338 and 332, respectively. A second lower compensation current receiving terminal EF<0> 343 for receiving a second lower compensation current signal is connected to a second terminal and to the collector terminal, respectively, of the resistor 332 and of the BJT 331, respectively. Emitter terminals of the BJTs 331 and 332 are connected to a first terminal of a resistor 344 of a second tail current branch 345. A second terminal of the resistor 344 is connected to ground.

The second lower compensation current receiving terminal EF<0> 343 is connected to the base terminal of a BJT 351 having an emitter terminal that is connected to a first terminal of a second current source 352 and having a collector terminal that is connected to the supply voltage $V_{CC\_TIA}$. A second voltage output terminal 354 is connected to the emitter terminal of the BJT 351 and to the first terminal of the second current source 352. A second terminal of the second current source 352 is connected to ground.

The differential amplifier circuit 300 utilizes current steering based on the pair of feedback signals $V_{BIAS0}$ and $V_{BIAS1}$ to adjust the gain of the differential amplifier circuit 300, thereby adjusting the gain of the TIA 203, as will now be described with reference to FIGS. 2 and 3. The pair of feedback signals $V_{BIAS0}$ and $V_{BIAS1}$ are adjusted by the first feedback loop 201 based on variations in the optical power detected by the OE detector 221 and the resulting input current signal received at the input current terminal 319. The BJTs 303 and 304 form the core of the current-steering mechanism.

The input current signal produced by the OE detector 221 and received by the input current terminal 319 is injected into the first tail current branch 317 and into the emitters of the BJTs 303 and 304. When the input current signal has a relatively small amplitude, the feedback, or bias voltage, signals $V_{BIAS0}$ and $V_{BIAS1}$ are such that almost all of the input current signal flows through BJT 303. When the input current signal has a relatively large amplitude, the bias voltage signals $V_{BIAS0}$ and $V_{BIAS1}$ are such that a first portion of the input current flows through BJT 303 and a second portion of the input current flows through BJT 304, which is how the gain of the TIA 203 is adjusted and controlled. The reason why the gain of this stage needs to be controlled is to make sure that the subsequent gain stage G1 213 is not pushed into the nonlinear region due to large voltage swings at its input. The first portion of the input current flows through the resistors 312 and 309 and generates a first output voltage signal, $V_{OUT1}$, which is then output at the first voltage output terminal 324. An emitter follower formed by BJT 321 and the first current source 322 buffers the first output voltage signal $V_{OUT1}$.

The replica stage 302 provides a replica DC bias for the subsequent gain stage G1 213 (FIG. 2) to enable the single-ended signal at the first voltage output terminal 324 to be converted into a differential output voltage signal comprising the first and second output voltage signals $V_{OUT1}$ and $V_{OUT2}$, respectively, that are outputted from the first and second voltage output terminals 324 and 354, respectively. In order to further reduce power consumption, the replica stage 302 is typically a scaled-down version of the differential amplifier stage 301.

Figure 4:
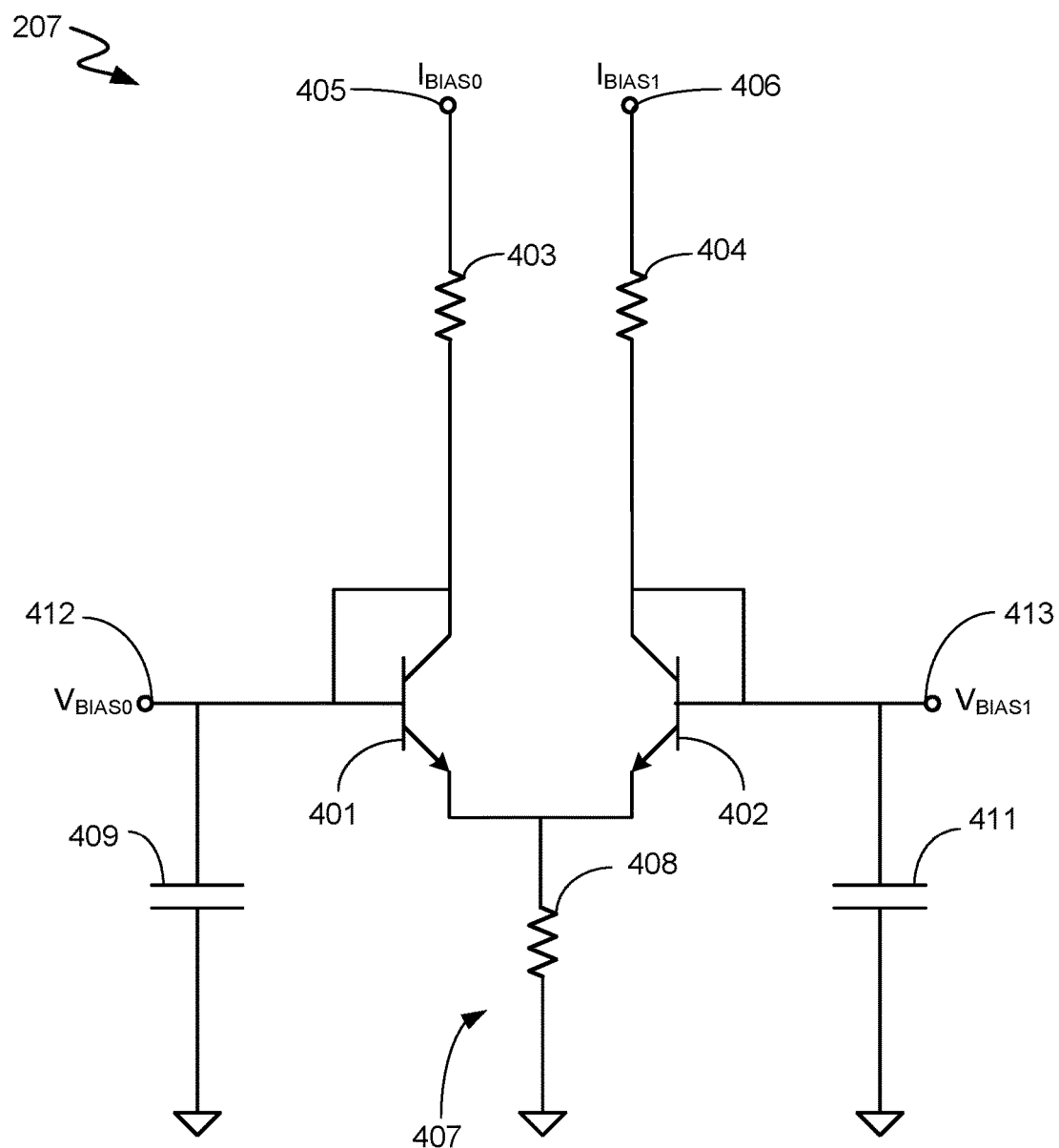
FIG. 4 illustrates a block diagram of the reference voltage generator circuit shown in FIG. 2, which generates the first and second bias voltage signals $V_{BIAS0}$ and $V_{BIAS1}$, respectively, that are fed back to the differential amplifier circuit shown in FIG. 3.

FIG. 4 illustrates a block diagram of the reference voltage generator circuit 207 shown in FIG. 2, which generates the first and second bias voltage signals, $V_{BIAS0}$ and $V_{BIAS1}$, respectively. The reference voltage generator circuit 207 receives the first and second bias current signals $I_{BIAS0}$ and $I_{BIAS1}$, respectively, generated by the reference current generator circuit 206 shown in FIG. 2 and converts them into the first and second bias voltage signals $V_{BIAS0}$ and $V_{BIAS1}$, respectively, which are fed back to the TIA 203 shown in FIGS. 2 and 3 to cause the gain of the TIA 203 to be adjusted, as described above with reference to FIG. 3.

The reference voltage generator circuit 207 has BJTs 401 and 402, each of which has its base terminal and collector terminal shorted together such that the BJTs 401 and 402 operate as diodes, resistors 403 and 404 having first terminals that are connected to first and second input terminals 405 and 406, respectively, of the circuit 207 and having second terminals that are connected to the collectors terminals of the BJTs 401 and 402, respectively. A tail current branch 407 of the circuit 207 has a resistor 408 that has a first terminal that is connected to the emitter terminals of the BJTs 401 and 402 and a second terminal that is connected to ground. The circuit 207 has capacitors 409 and 411 that have first terminals that are connected to first and second bias voltage output terminals 412 and 413, respectively, of the circuit 207 and second terminals that are connected to ground. The first and second bias currents $I_{BIAS0}$ and $I_{BIAS1}$, respectively, received at the first and second input terminals 405 and 406, respectively, flow through the BJTs 401 and 402, respectively, causing the first and second bias voltages $V_{BIAS0}$ and $V_{BIAS1}$, respectively, to be generated at the first and second bias voltage output terminals 412 and 413, respectively. The capacitors 409 and 411 that are connected to the first and second bias voltage output terminals 412 and 413, respectively, filter out power supply noise and ensure that the output terminals 412 and 413 remain at a stable voltage.

Figure 5:
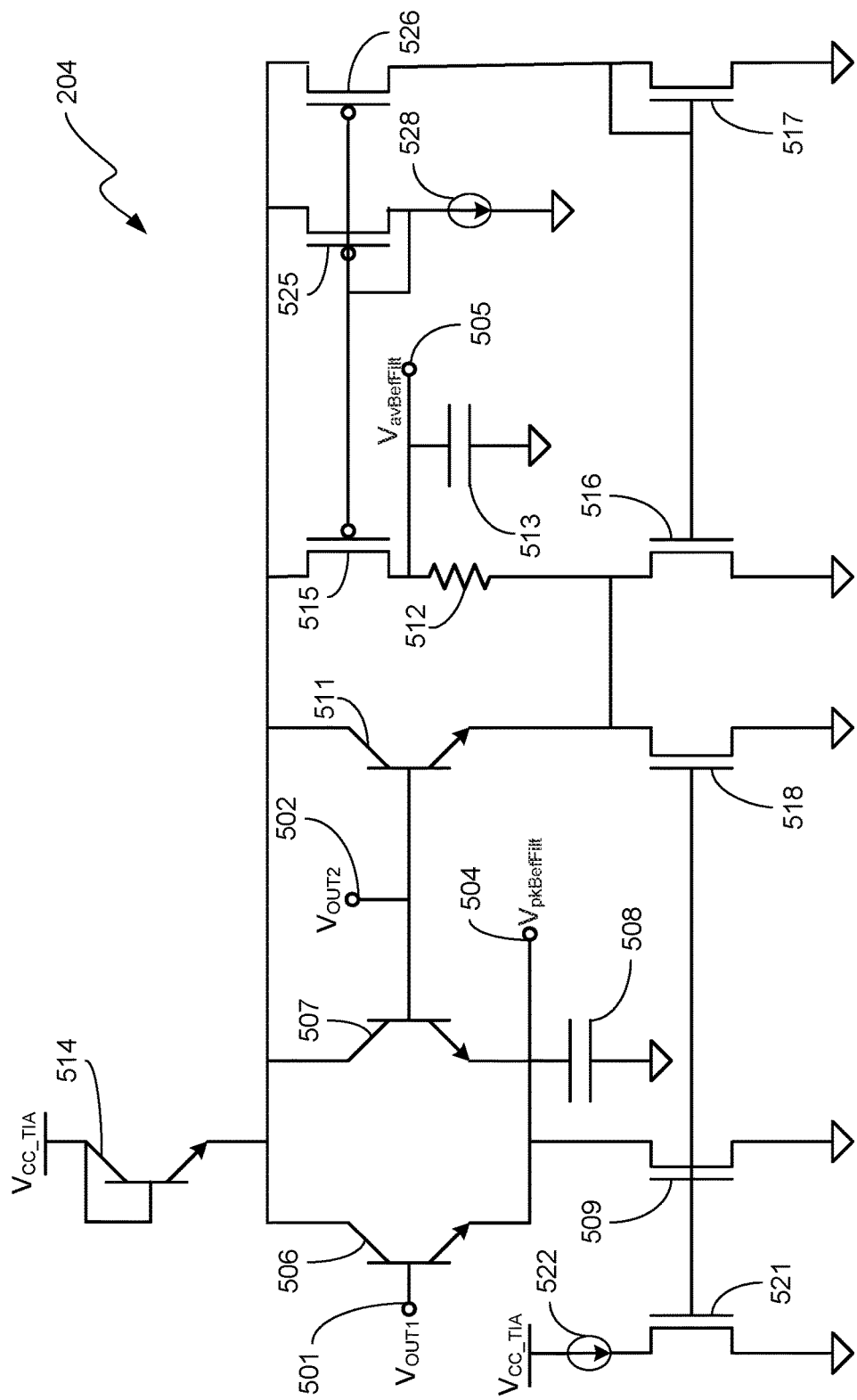
FIG. 5 illustrates a block diagram of the first peak detector shown in FIG. 2 in accordance with a representative embodiment.

FIG. 5 illustrates a block diagram of the first peak detector 204 shown in FIG. 2 in accordance with a representative embodiment. The first peak detector 204 receives the first and second output voltage signals $V_{OUT1}$ and $V_{OUT2}$, respectively, that are output from the first and second voltage output terminals 324 and 354, respectively, of the differential amplifier circuit 300 at first and second input terminals 501 and 502, respectively, senses the voltage swing and compares it with a reference voltage to generate a differential output voltage signal comprising first and second output voltage signals $V_{pkBefFilt}$ and $V_{avBefFilt}$, respectively. The differential output voltage signal $V_{pkBefFilt}$, $V_{avBefFilt}$ is outputted at first and second output terminals 504 and 505, respectively, of the first peak detector 204. The differential voltage signal comprising the first and second output voltage signals $V_{pkBefFilt}$ and $V_{avBefFilt}$, respectively, tracks the peak voltage of the differential input signal. $V_{OUT1}$, $V_{OUT2}$.

As will be described below with reference to FIG. 6, the first differential Op Amp 205 shown in FIG. 2 receives the differential voltage signal VpkBefFilt, VavBefFilt and generates a differential output voltage signal comprising voltage signals $V_{OTAP}$ and $V_{OTAM}$. The differential output voltage signal comprising voltage signals $V_{OTAP}$ and $V_{OTAM}$ is then received by the reference current generator 206 shown in FIG. 2 and used by it to generate the first and second reference current signals. $I_{BIAS0}$ and $I_{BIAS1}$, respectively, that are inputted to first and second input terminals 405 and 406, respectively, of the reference voltage generator circuit 207 shown in FIG. 4. As described above, the reference voltage generator circuit 207 converts the first and second reference current signals, $I_{BIAS0}$ and $I_{BIAS1}$, respectively, into the first and second feedback signals, $V_{BIAS0}$ and $V_{BIAS1}$, respectively, which are fed back to the differential amplifier circuit 300 of the TIA 203 and used to adjust the gain thereof via current steering.

The BJTs 506 and 507, the capacitor 508 and the NMOS 509 form a peak detection portion of the peak detector circuit 200 that generates the voltage signal $V_{pkBefFilt}$ at the first output terminal 504, which tracks the peak voltage of the differential voltage output signal $V_{OUT1}$, $V_{OUT2}$ received at the first and second input terminals 501 and 502, respectively. BJT 511 senses $V_{OUT2}$ and generates a voltage signal $V_{avBefFilt}$ at the second output terminal 505 that is pulled up slightly through resistor 512 and sent to the first differential Op Amp 205. A capacitor 513 has a first terminal that is connected to the second output terminal 502 and a second terminal that is connected to ground. A first terminal of the resistor 512 is connected to a drain terminal of a PMOS 515 having a source terminal that is connected to the emitter terminal of the BJT 514. The gate terminal of the PMOS 515 is connected to the gate terminals of MPOSs 525 and 526.

A current source 528 has a first terminal that is connected to the drain of the PMOS 525 and a second terminal that is connected to ground. A second terminal of the resistor 512 is connected to a source terminal of an NMOS 516 having a drain that is connected to ground. A gate of the NMOS 516 is connected to a gate of an NMOS 517 that is shorted to a source of the NMOS 517. A drain of the NMOS 517 is connected to ground. An NMOS 518 has a source terminal that is connected to the source terminal of NMOS 516 and a drain terminal that is connected to ground. A gate terminal of NMOS 518 is connected to the gate terminals of NMOSs 509 and 521.

A current source 522 has a first terminal that is connected to the supply voltage $V_{CC\_TIA}$ and a second terminal that is connected to the source terminal of the NMOS 521. The drain terminal of the NMOS 521 is connected to ground. The BJT 514 has a base terminal and a collector terminal that are shorted together and connected to the supply voltage $V_{CC\_TIA}$. The emitter terminal of the BJT 514 is connected to the collector terminals of BJTs 506 and 507. The base terminals of BJTs 506 and 507 are connected to the first and second input terminals 501 and 502, respectively. The capacitor 508 has a first terminal that is connected to the emitter terminals of the BJTs 506 and 507 and a second terminal that is connected to ground.

The peak-to-peak voltage difference between first and second input terminals 501 and 502, respectively, appears at the first output terminal 504 as $V_{pkBefFilt}$ and the average of the two appears at the second output terminal 505 as $V_{avBefFilt}$. The difference between $V_{avBefFilt}$ and $V_{pkBefFilt}$ can be controlled by varying the current produced by the current source 528. If the current produced by the current source 528 is increased, then $V_{avBefFilt}$ gets pulled higher, and consequently the first differential Op Amp 205 shown in FIGS. 2 and 6 tries to equalize its two inputs by adjusting its output voltage signals, $V_{OTAP}$ and $V_{OTAM}$, such that the TIA 203 has to work harder to provide more gain and more swing, which causes $V_{pkBefFilt}$ to also gets pulled higher. This is one way of tuning the TIA 203 output swing to a desired value.

Figure 6:
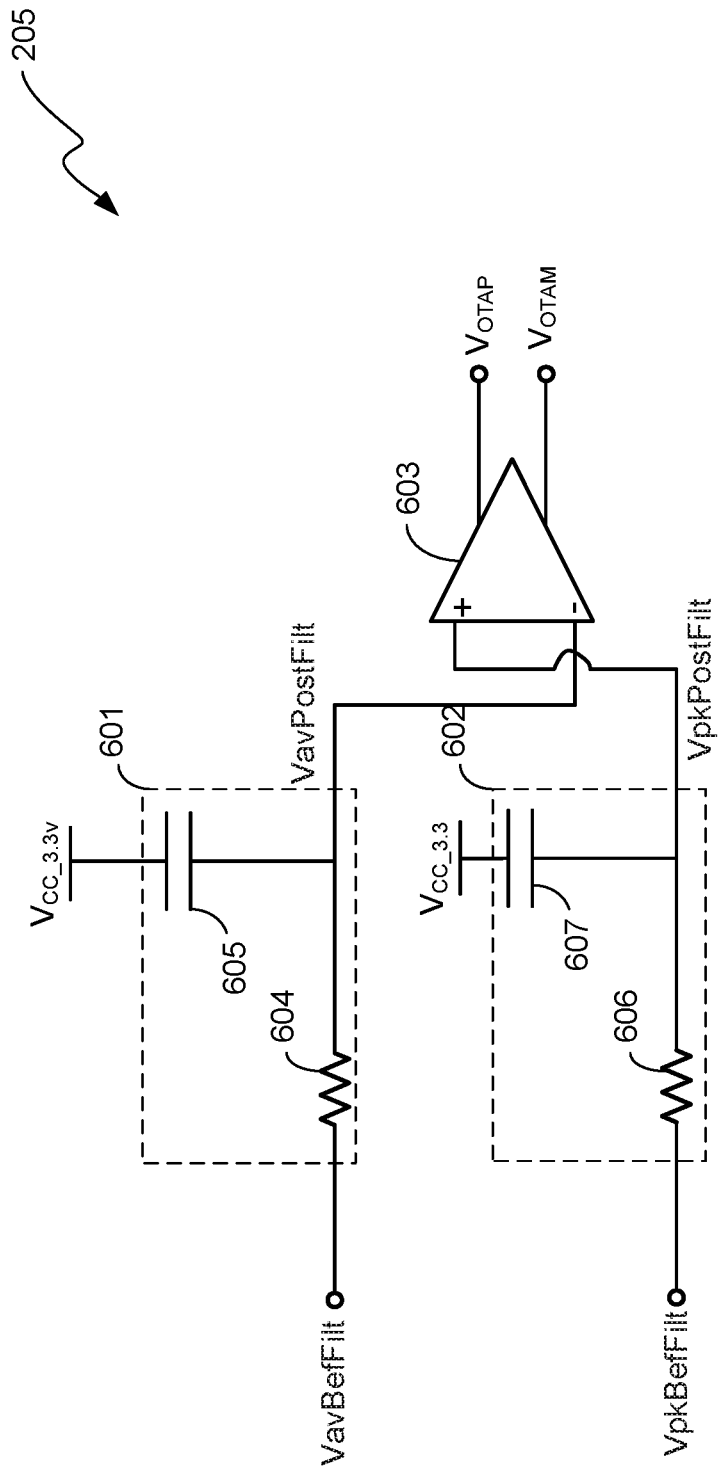
FIG. 6 illustrates a block diagram of the first differential operational amplifier shown in FIG. 2 in accordance with a representative embodiment.

FIG. 6 illustrates a block diagram of the first differential Op Amp 205 shown in FIG. 2. In accordance with this representative embodiment, the first differential Op Amp 205 has first and second filter circuits 601 and 602, respectively, and an Op Amp 603. The first and second filter circuits 601 and 602 are connected to the inverting and noninverting input terminals, respectively, of the Op Amp 603. The first filter circuit 601 has a resistor 604 and a capacitor 605. Likewise, the second filter circuit 603 has a resistor 606 and a capacitor 607. The second output voltage signal $V_{avBefFilt}$ that is outputted from the second output terminal 505 of the peak detector circuit 204 shown in FIG. 5 is filtered by the first filter circuit 601 and the filtered voltage signal, $V_{pkPostFilt}$, is applied to the inverting input terminal of the Op Amp 603. The first output voltage signal $V_{pkBefFilt}$ that is outputted from the first output terminal 502 of the peak detector circuit 204 shown in FIG. 5 is filtered by the second filter circuit 602 and the filtered voltage signal, $V_{pkPostFilt}$, is applied to the noninverting input terminal of the Op Amp 603. The Op Amp 603 receives the filtered voltage signals $V_{avBefFilt}$ and $V_{avPostFilt}$ and amplifies them to produce output voltage signals $V_{OTAP}$ and $V_{OTAM}$, respectively.

The output voltage signals $V_{OTAM}$ and $V_{OTAP}$ are then received at the gate terminals of the PMOSs 216 and 217, respectively, of the reference current generator circuit 206 shown in FIG. 2, thereby causing the first and second reference current signals, $I_{BIAS0}$ and $I_{BIAS1}$, respectively, to flow through the PMOSs 216 and 217, respectively, and into the reference voltage generator circuit 207 shown in FIGS. 2 and 4. As indicated above, the reference voltage generator circuit 207 converts the first and second reference current signals, $I_{BIAS0}$ and $I_{BIAS1}$, respectively, into the first and second feedback signals. $V_{BIAS0}$ and $V_{BIAS1}$, respectively, which are then fed back to the differential amplifier circuit 300 (FIG. 3) of the TIA 203 (FIG. 2).

When the gain of the differential amplifier circuit 300 shown in FIG. 3 is too high, $V_{pkPostFilt}$ exceeds $V_{avPostFilt}$, and therefore the first differential Op Amp 205 increases $V_{OTAP}$ and decreases $V_{OTAM}$. Consequently, the second reference current signal $I_{BIAS1}$ is decreased and the first reference current signal $I_{BIAS1}$ is increased, which results in a decrease in the second feedback signal $V_{BIAS1}$ and an increase in the first feedback signal $V_{BIAS0}$. The decrease in the second feedback signal $V_{BIAS1}$ and the increase in the first feedback signal $V_{BIAS0}$ causes the input current received at the input current terminal 319 (FIG. 3) to be steered in such a way that the gain of the TIA 203 is reduced. When the gain of the differential amplifier circuit 300 shown in FIG. 3 is too low, $V_{avPostFilt}$ exceeds $V_{pkPostFilt}$, and therefore the first differential Op Amp 205 increases $V_{OTAM}$ and decreases $V_{OTAP}$. Consequently, the second reference current signal $I_{BIAS1}$ is increased and the first reference current signal $I_{BIAS0}$ is decreased, which results in a decrease in the first feedback signal $V_{BIAS0}$ and an increase in the second feedback signal $V_{BIAS1}$. The decrease in the first feedback signal $V_{BIAS0}$ and the increase in the second feedback signal $V_{BIAS1}$ causes the input current received at the input current terminal 319 (FIG. 3) to be steered in such a way that the gain of the TIA 203 is increased.

It should be noted that while the first peak detector 204 and the first differential Op Amp 205 are depicted and described as separate circuits, they can be considered as a single peak detector circuit that detects the peak-to-peak voltage swing of the differential output voltage signal at the first and second voltage output terminals 324 and 354, respectively, of the differential amplifier circuit 300 to generate first and second correction signals $V_{OTAP}$ and $V_{OTAM}$ that are fed back to the reference current generator circuit 206 (FIG. 2) and used thereby to generate the first and second reference current signals $I_{BIAS0}$ and $I_{BIAS1}$.

With reference again to FIGS. 2 and 3, as current is steered away from BJT 303 into BJT 304, the DC voltage at the first lower compensation current receiving terminal EF<1> 315 increases, which increases the DC voltage at the first voltage output terminal 324 of the differential amplifier circuit 300. Consequently, the input BJTs (not shown) of the gain stage G1 213 are pushed into the linear region and the bandwidth and performance of the radio frequency (RF) path degrades. If the DC voltage signals at the first and second voltage output terminals 324 and 354, respectively, are too low, the first gain stage G1 213 will not have enough headroom to operate properly. In accordance with a representative embodiment, the TIA 203 shown in FIG. 2 includes first and second current compensation circuits that add or remove current from the differential amplifier circuit 300 to prevent these potential problems from occurring, as will now be described with reference to FIGS. 7 and 8.

Figure 7:
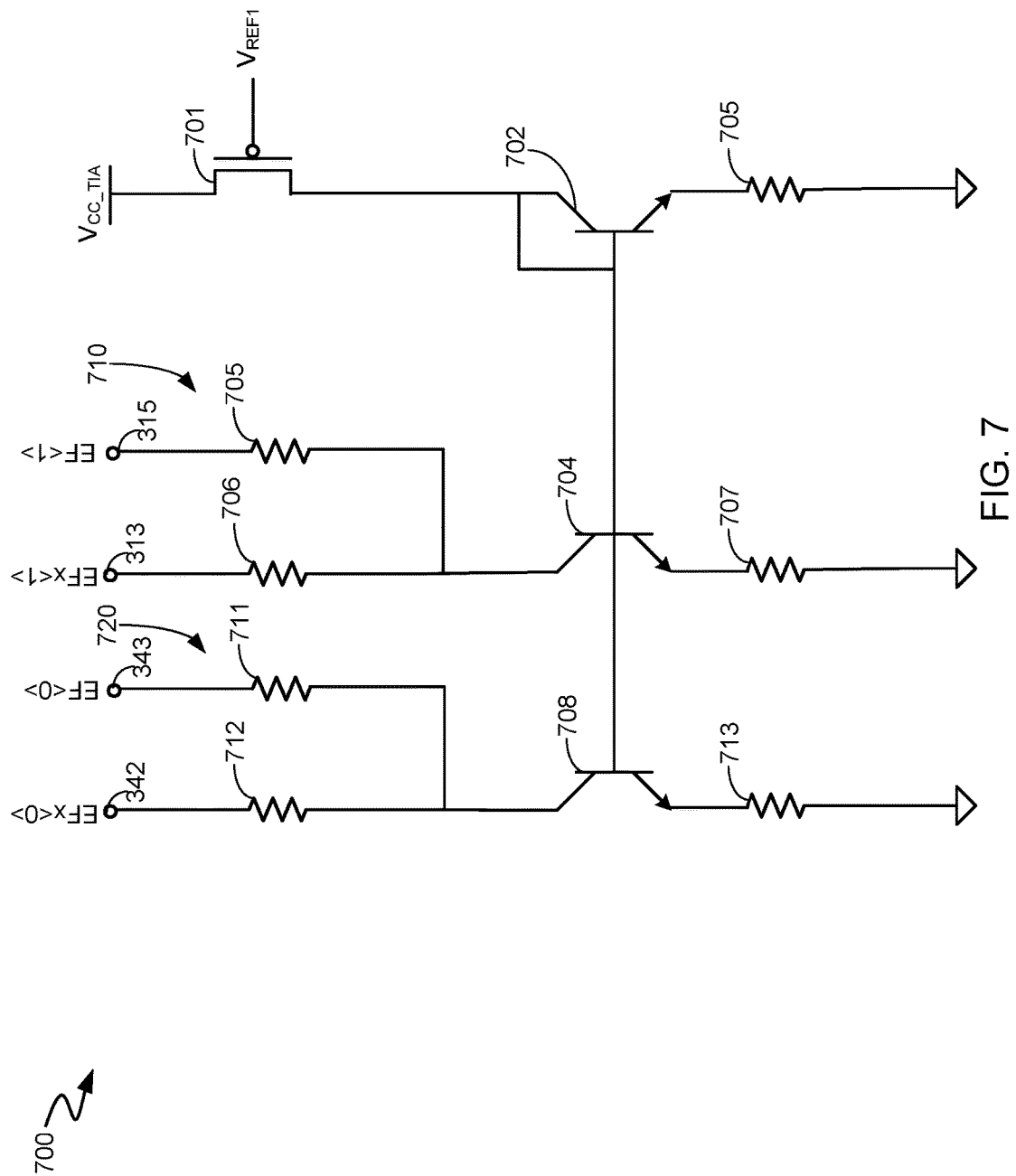
FIG. 7 illustrates a block diagram of a first current compensation circuit of the TIA shown in FIG. 2 in accordance with a representative embodiment.

FIG. 7 illustrates a block diagram of the first current compensation circuit 700 in accordance with a representative embodiment. The gate terminal of a PMOS 701 is connected to the gate terminal of PMOS 337 of the replica stage 302 shown in FIG. 3. As the photocurrent generated by the OE detector 221 (FIG. 2) increases, which is received at input current terminal 319 (FIG. 3), the first feedback signal $V_{BIAS0}$ increases and the second feedback signal $V_{BIAS1}$ decreases. The increase in the first feedback signal $V_{BIAS0}$ causes the DC current flowing through BJT 332 to increase, which also flows through PMOS 337 generating a reference voltage, $V_{REF1}$, at the gate terminal of PMOS 337. Because the gate terminals of PMOSs 337 and 701 are connected together, the same reference voltage is received at the gate of PMOS 701, thereby causing the current that flows through BJT 332 and PMOS 337 to be mirrored and thereby made to flow through PMOS 701. The current flowing through PMOS 701 is pushed into BJT 702, which has a collector terminal that is connected to the drain of PMOS 701, a base terminal that is connected to a base terminal of a BJT 704 and an emitter terminal that is connected to a first terminal of resistor 705. The second terminal of resistor 705 is connected to ground.

The first current compensation circuit 700 has first and second current mirrors 710 and 720, respectively. The first current mirror 710 includes the BJT 704 and resistors 705-707. The second current mirror 720 includes the BJT 708 and resistors 711-713. The base terminals of the BJTs 702, 704 and 708 are connected together such that the current that flows through BJT 702 is mirrored and thereby made to flow through BJTs 704 and 708. The resistor 705 of the first current mirror 710 has a first terminal that is connected to the first lower compensation current receiving terminal EF<1> 315 of the differential amplifier stage 301 (FIG. 3) and a second terminal that connected to the collector terminal of BJT 704. The resistor 706 of the first current mirror 710 has a first terminal that is connected to the first upper compensation current receiving terminal EFx<1> 313 (FIG. 3) and a second terminal that connected to the collector terminal of BJT 704. The resistor 711 of the second current mirror 720 has a first terminal that is connected to the second lower compensation current receiving terminal EF<0> 343 of the replica stage 302 (FIG. 3) and a second terminal that is connected to the collector terminal of BJT 708. The resistor 712 of the second current mirror 710 has a first terminal that is connected to the second upper compensation current receiving terminal EFx<0> 342 (FIG. 3) and a second terminal that connected to the collector terminal of BJT 708.

As input current received at the input current terminal 319 (FIG. 3) increases, BJTs 704 and 708 pull increasing amounts of current from the terminals EFx<1> 313, EFx<0> 342, EF<1> 315 and EF<0> 343, thereby reducing the levels of the DC currents that are flowing in these branches of the differential amplifier circuit 300 of the TIA 203 to more tolerable levels. This is essentially an open-loop scheme for adjusting the DC current levels as the photocurrent generated by the OE detector 221 increases.

As stated above, if the first and second output voltage signals, $V_{OUT1}$ and $V_{OUT2}$, respectively, at the first and second voltage output terminals 324 and 354, respectively, are too low, the first gain stage G1 213 will not have enough headroom to operate properly. The second current compensation circuit 800 shown in FIG. 8 ensures that the first and second output voltage signals $V_{OUT1}$ and $V_{OUT2}$, respectively, at the first and second voltage output terminals 324 and 354, respectively, are always sufficiently high to provide enough voltage headroom for the first gain stage G1 213 to operate properly. In accordance with this representative embodiment, the second current compensation circuit 800 is an Op Amp made up of NMOSs 801-806. PMOSs 811-814, resistor 815 and variable resistor 816. The drain terminals of NMOSs 801 and 802 are connected together and are connected to the source terminal of NMOS 803. The gate terminals of NMOSs 803-806 are connected together. The source terminals of PMOSs 811-814 are connected to the supply voltage $V_{CC\_TIA}$. The drain terminals of PMOSs 811 and 812 are connected to the source terminals of NMOSs 801 and 802, respectively. The drain terminals of NMOSs 803-806 are connected to ground. The drain terminal of PMOS 812 is connected to the gate terminals of PMOSs 813 and 814.

The gate terminals of NMOSs 801 and 802 are connected to first and second input terminals 817 and 816, respectively, of the circuit 800. The second input terminal 816 is connected to the second and first terminals of the resistor 815 and variable resistor 816, respectively. The first terminal of resistor 815 is connected to a supply voltage $V_{CC\_2.5V}$. The supply voltage $V_{CC\_2.5V}$ is a 2.5 v supply voltage used for the first gain stage G1 213. The TIA 203 uses the larger 3.3 v supply voltage to provide it sufficient voltage headroom for the TIA 203 to operate properly. The first, second and third gain stages G1 213, G2 214 and G3 215 do not need as much voltage headroom as the TIA 203 in order to operate properly and therefore use the smaller supply voltage $V_{CC\_2.5V}$ in order to reduce power consumption. A reference current, $I_{REF}$, generated by a current source (not shown) is injected into the source of NMOS 806, which is tied to the gates of NMOSs 806, 803, 804 and 805. A reference voltage $V_{REF1}$ received at the input terminal 816 and at the gate terminal of NMOS 802 tracks the 2.5 v supply voltage that is used for the first gain stage G1 213. The second output voltage $V_{OUT2}$ that is outputted from the second voltage output terminal 354 of the replica stage 302 (FIG. 3) is received at input terminal 817 and at the gate of NMOS 801. The second current compensation circuit 800 ensures that the second output voltage $V_{OUT2}$ remains below $V_{REFG1}$ so that it does not saturate the first gain stage G1 213.

Figure 8:
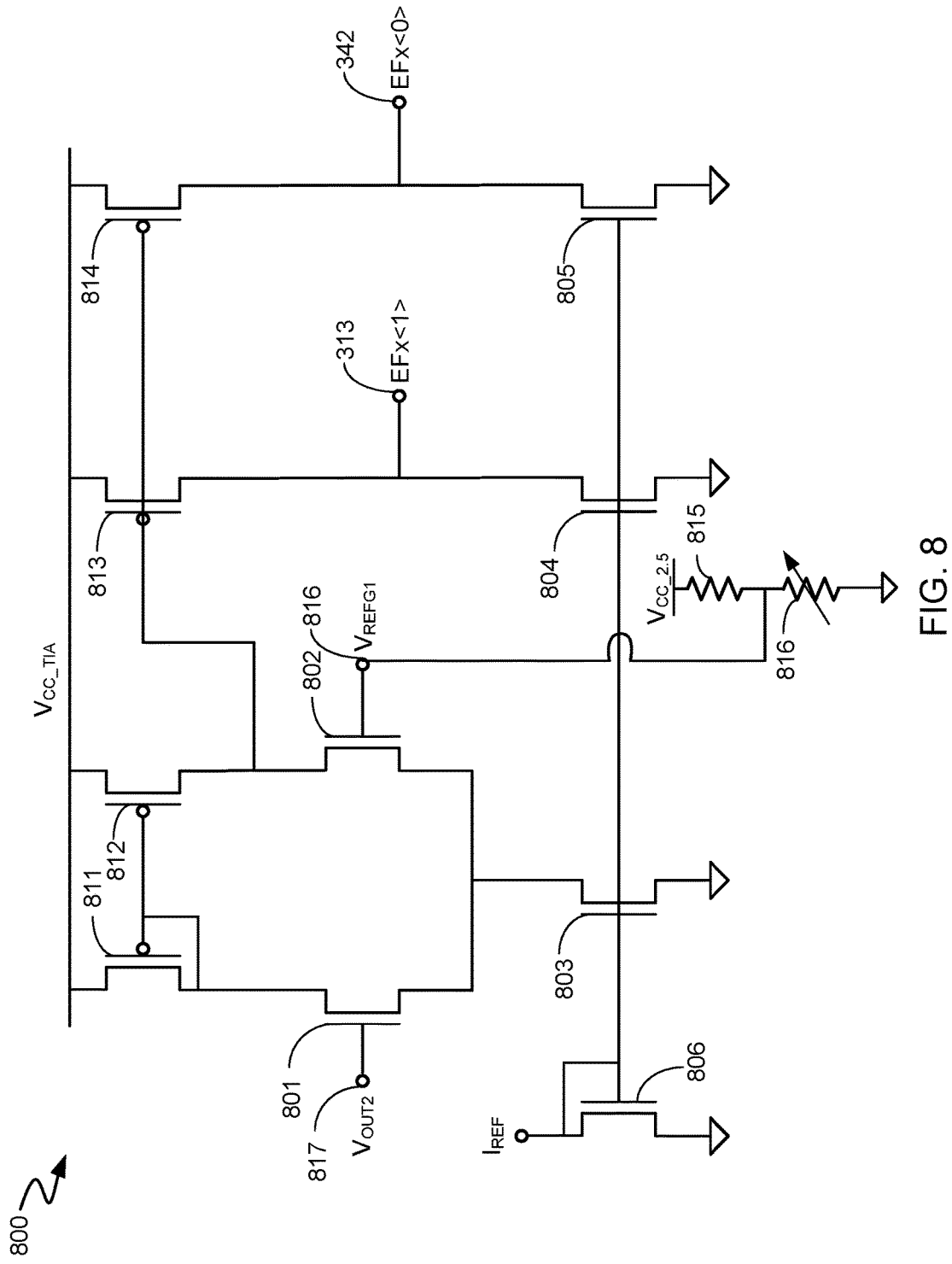
FIG. 8 illustrates a block diagram of a second current compensation circuit of the TIA shown in FIG. 2 in accordance with a representative embodiment.

The first and second current compensation circuits 700 and 800, respectively, shown in FIGS. 7 and 8, respectively, together help to maintain the first and second output voltage signals, $V_{OUT1}$ and $V_{OUT2}$ respectively, (FIG. 3) in a certain range. With reference again to FIG. 2, when the optical power incident on the OE detector 221 increases, more current is generated by the OE detector 221, which flows into the TIA 203. Consequently, the AGC circuitry comprising the TIA 203, the peak detector 204, the differential Op Amp 205, the reference current generator circuit 206, and the reference voltage generator circuit 207 attempts to reduce the gain of the TIA 203 by decreasing the second bias voltage signal $V_{BIAS1}$ at the input terminal 307 and by increasing the first bias voltage signal $V_{BIAS0}$ at the input terminal 306. Consequently, not only is the gain of the TIA 203 reduced due to less current flowing into the emitter terminal of BJT 303, but the DC voltage at terminal EF<1> 315 is also increased. This means that the first and second output voltage signals $V_{OUT1}$ and $V_{OUT2}$ at the first and second voltage output terminals 324 and 354, respectively, is also increased. This could potentially present a problem for the subsequent gain stage G1 213, which needs its input voltage signal to be in a certain voltage range. The first and second current compensation circuits 700 and 800, respectively, shown in FIGS. 7 and 8, respectively, help to alleviate this potential problem.

As the second bias voltage signal $V_{BIAS1}$ at the input terminal 307 decreases and the first bias voltage signal $V_{BIAS0}$ at the input terminal 306 increases, more current flows through PMOS 337. Consequently, more current flows through PMOS 701 (FIG. 7, which also flows through BJT 702 and is mirrored out to BJTs 704 and 708. The BJTs 704 and 708, in turn, pull current out of terminals EFx<0> 342, EF<0> 343, EFx<1> 313 and EF<1> 315. Thus, the voltages at terminals FE<0> 343 and EF<1> 315 get pulled down and are maintained in the desired range. Also, due to the manner in which the feedback loop is arranged, PMOS 813 and NMOS 804 try to adjust the current at terminal EFx<1> 313, and similarly PMOS 814 and NMOS 805 try to adjust the current at terminal EFx<0> 342, which, in turn, pulls down the voltages at terminals EF<0> 343 and EF<1> 315.

As for the reason why the compensation current is fed to terminals EFx<1> 313 and EF<1> 315 instead of feeding it all to terminal EF<1> 315, the parasitic capacitance is reduced by splitting up the compensation current into two parts and feeding the parts separately, which reduces degradation of the bandwidth of the TIA circuit 200. The compensation circuitry is split up into the first and second current compensation circuits 700 and 800, respectively, because the Op Amp shown in FIG. 8 is susceptible to power supply noise. By splitting the current compensation circuitry into the circuits shown in FIG. 7 and FIG. 8, smaller devices and currents can be used in the Op Amp shown in FIG. 8, thereby alleviating power supply noise issues.

Figure 9:
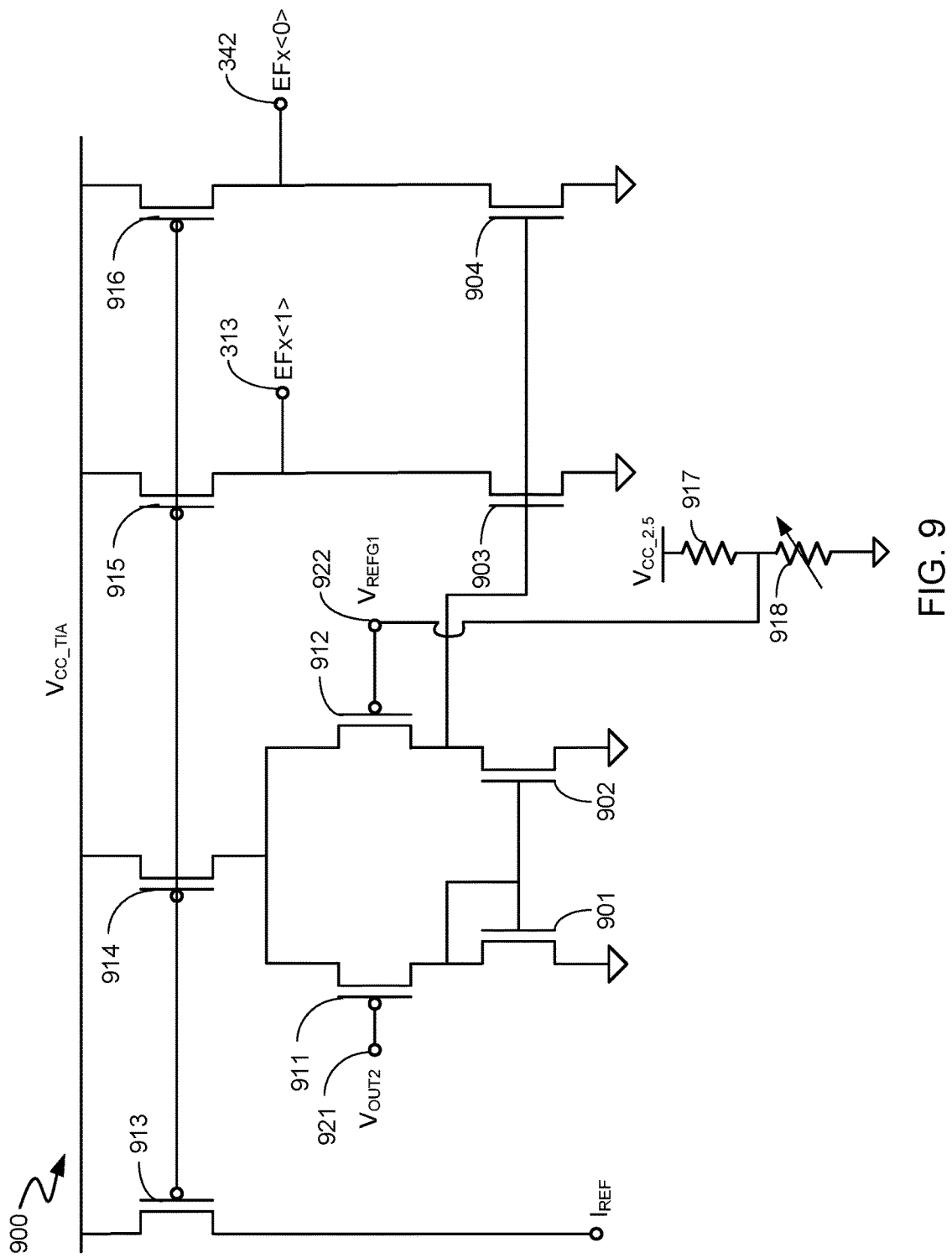
FIG. 9 illustrates a block diagram of the second current compensation circuit of the TIA shown in FIG. 2 in accordance with another representative embodiment.

FIG. 9 illustrates a block diagram of the second current compensation circuit 900 in accordance with another representative embodiment. In accordance with this representative embodiment, the second current compensation circuit 900 is an Op Amp made up of NMOSs 901-904, PMOSs 911-916, resistor 917 and variable resistor 918. The source terminals of PMOSs 911 and 912 are connected together and are connected to the drain terminal of PMOS 914. The gate terminals of PMOSs 913-916 are connected together. The source terminals of PMOSs 913-916 are connected to the supply voltage $V_{CC\_TIA}$ The drain terminals of PMOSs 911 and 912 are connected to the source terminals of NMOSs 901 and 902, respectively. The drain terminals of NMOSs 901-904 are connected to ground. The source terminal of NMOS 902 is connected to the gate terminals of NMOS 903 and 904. The gate terminals of PMOSs 911 and 912 are connected to first and second input terminals 921 and 922, respectively, of the circuit 900. The second input terminal 922 is connected to the second and first terminals of the resistor 917 and variable resistor 918, respectively.

The second current compensation circuit 800 shown in FIG. 8 uses NMOSs 801 and 802 as the driving transistors whereas the second current compensation circuit 900 shown in FIG. 9 uses PMOSs 911 and 912 as the driving transistors. Otherwise, the operation of the two circuits 800 and 900 is quite similar, as will be understood by those of skill in the art.

The feedback mechanism provided by the second current compensation circuits 800 and 900 helps ensure that the differential amplifier circuit 300 (FIG. 3) operates well over voltage, temperature and process variations and any mismatch corners. The circuits 800 and 900 are relatively small circuits that take up very little space on the TIA circuit IC chip, consume very little power and do not cause any power supply noise issues.

Figure 10:
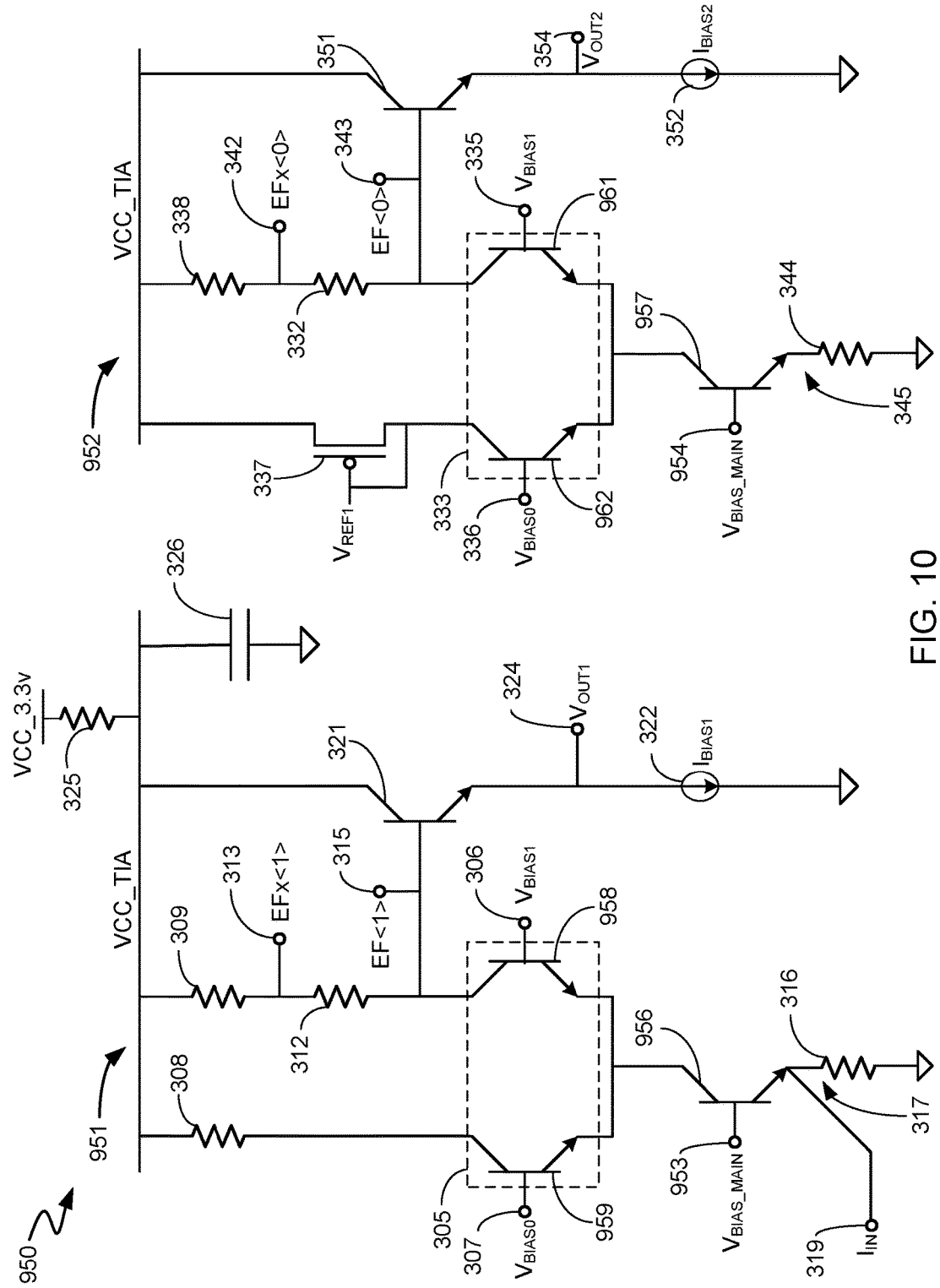
FIG. 10 illustrates the differential amplifier circuit of the TIA shown in FIG. 2 in accordance with another representative embodiment.

FIG. 10 illustrates the differential amplifier circuit 950 of the TIA 203 shown in FIG. 2 in accordance with another representative embodiment. The differential amplifier circuit 950 is very similar to the differential amplifier circuit 300 shown in FIG. 3. In FIG. 10, the BJT 311 shown in FIG. 3 has been eliminated, BJTs 956 and 957 have been added to the tail current branches 317 and 345, respectively, and BJTs 958 and 959 are cascoded with BJT 956. The collector terminal of the BJT 956 is connected to the emitter terminals of BJTs 958 and 959. The collector terminal of the BJT 957 is connected to the emitter terminals of BJTs 961 and 962. In all other respects, the differential amplifier circuit 950 is identical to the differential amplifier circuit 300 and operates in generally the same manner to adjust the gain of the differential amplifier circuit 950 via current steering.

Figure 11:
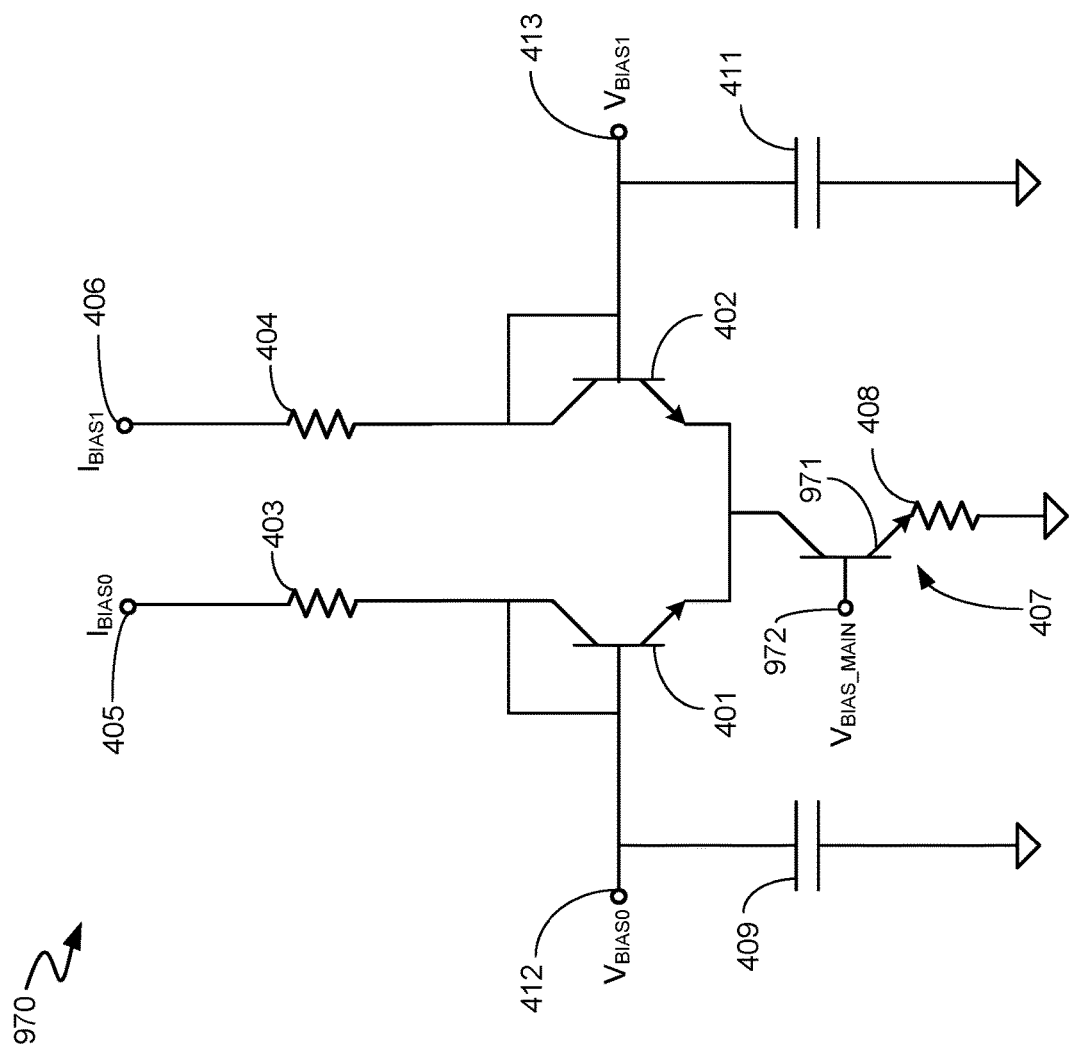
FIG. 11 illustrates the reference voltage generator circuit shown in FIG. 2 in accordance with another representative embodiment that is configured to work with the differential amplifier circuit shown in FIG. 10.

FIG. 11 illustrates a reference voltage generator circuit 970 that is configured to work with the differential amplifier circuit 950 shown in FIG. 10. The reference voltage generator circuit 970 is identical to the reference voltage generator circuit 207 shown in FIG. 4 except that the reference voltage generator circuit 970 includes a BJT 971 that is not included in the circuit shown in FIG. 4. The BJT 971 has a collector terminal that is connected to the emitter terminals of BJTs 401 and 402 and has an emitter terminal that is connected to the first terminal of resistor 408. The reference voltage generator circuit 970 operates in the same manner as the reference voltage generator circuit 207 shown in FIG. 4, but generates three feedback signals, $V_{BIAS0}$, $V_{BIAS1}$ and $V_{BIAS\_MAIN}$, rather than the two feedback signals, $V_{BIAS0}$ and $V_{BIAS1}$, that are generated by the reference voltage generator circuit 207 shown in FIG. 4. The additional feedback signal $V_{BIAS\_MAIN}$ is outputted from the reference voltage generator circuit 970 at a third output terminal 972 of the circuit 970 corresponding to the base terminal of BJT 971.

With reference again to FIG. 10, the additional feedback signal $V_{BIAS\_MAIN}$ is received at third and fourth input terminals 953 and 954, respectively, of the differential amplifier stage 951 and of the replica stage 952, respectively. The current input terminal 319 is connected to the emitter terminal of BJT 956. The additional feedback signal $V_{BIAS\_MAIN}$ adjusts the bias voltage of the BJT 956, thereby adjusting the current flowing from the collector terminal of the BJT 956 to the emitter terminal of the BJT 956.

The primary difference between the differential amplifier circuit 950 shown in FIG. 10 and the differential amplifier circuit 300 shown in FIG. 3 is that the BJTs 958, 959 and 956 are connected in the cascode arrangement. The current steering-based gain control provided by the circuit 950 is accomplished through the BJTs 958 and 959 instead of through the BJT 304 attached to the BJT 311 of FIG. 3 operating as a diode. This provides an advantage in terms of optimum sizing of the BJT 956 that acts as the input transistor in FIG. 10 for better bandwidth and sensitivity compared to the use of the BJT 304 as the input transistor in FIG. 3. In some cases, the input transistor 304 in FIG. 3 will be relatively large width, which can add parasitic capacitance at the terminal EFx<1> 315 shown in FIG. 3. This can cause some bandwidth degradation. In the differential amplifier circuit 950 shown in FIG. 10, the BJTs 958 and 959 need not be large in size, and therefore do not load the terminal EF<1> 315 with parasitic capacitance. Consequently, the bandwidth of the differential amplifier circuit 950 is degraded less than the bandwidth of the differential amplifier circuit 300 shown in FIG. 3. However, the differential amplifier circuit 950 uses more voltage headroom than the differential amplifier circuit 300. Persons of skill in the art will understand which of these configurations is most suitable for a given application.

It should be noted that although the illustrative embodiments have been described with reference to a few illustrative embodiments for the purpose of demonstrating the principles and concepts of the invention. Persons of skill in the art will understand how the principles and concepts of the invention can be applied to other embodiments not explicitly described herein. It should also be noted that the circuits and method described above with reference to FIGS. 1-11 are merely examples of suitable circuit configurations and methods that demonstrate the principles and concepts of the invention. As will be understood by those skilled in the art in view of the description being provided herein, many modifications may be made to the embodiments described herein while still achieving the goals of the invention, and all such modifications are within the scope of the invention.

What is claimed is:

1. A method of amplifying an input current signal, comprising:
   injecting the input current signal to a tail current branch of a first differential amplifier having first input terminals that receive a first pair of feedback voltage signals, $V_{BIAS0}$ and $V_{BIAS1}$;
   with the first differential amplifier, generating a first output signal;
   with a second differential amplifier having second input terminals that receive the first pair of feedback signals, $V_{BIAS0}$ and $V_{BIAS1}$, generating a second output signal, wherein the first and second output signals form a differential voltage output signal;
   with a peak detector, detecting the peak of the differential voltage output signal;
   using the detected peak to generate the second pair of feedback voltage signals, $V_{OTAP}$ and $V_{OTAM}$;
   using a reference current generator circuit to convert the second pair of voltage feedback signals, $V_{OTAP}$ and $V_{OTAM}$, into a first pair of feedback reference current signals, $I_{BIAS0}$ and $I_{BIAS1}$;
   using a reference voltage generator circuit to convert the first pair of reference current feedback signals, $I_{BIAS0}$ and $I_{BIAS1}$, into the first pair of feedback voltage signals, $V_{BIAS0}$ and $V_{BIAS1}$; and
   feeding the first pair of feedback voltage signals, $V_{BIAS0}$ and $V_{BIAS1}$, back to the first input terminals to cause current flowing in the first and second differential amplifiers to be steered in a such a way that a gain of the first and second differential amplifiers is controllably adjusted.

2. The method of claim 1, further comprising:
   generating a first lower compensation current signal and coupling the first lower compensation current signal into a first lower compensation current receiving terminal of the first differential amplifier; and
   generating a second lower compensation current signal and coupling the second lower compensation current signal into a second lower compensation current receiving terminal of the second differential amplifier.

3. The method of claim 2, further comprising:
   generating a first upper compensation current signal and coupling the first upper compensation current signal into a first upper compensation current receiving terminal of the first differential amplifier; and
   generating a second upper compensation current signal and coupling the second upper compensation current signal into a second upper compensation current receiving terminal of the second differential amplifier.

4. A transimpedance amplifier, comprising:
   first and second differential amplifiers electrically coupled to first and second tail current branches, respectively, of the transimpedance amplifier, the first and second differential amplifiers having first and second voltage output terminals, respectively, for outputting first and second output voltage signals therefrom, respectively, the first and second differential amplifiers having first input terminals for receiving a first pair of feedback voltage signals, $V_{BIAS0}$ and $V_{BIAS1}$, respectively, the first current tail branch having an input current terminal for receiving an input current signal such that a common mode current of the first differential amplifier changes in accordance with the input current signal;
   a peak detector electrically coupled to the first and second voltage output terminals, the peak detector detecting a peak of the differential voltage output signal and generating a second pair of feedback voltage signals, $V_{OTAP}$ and $V_{OTAM}$;
   a reference current generator circuit using the detected peak to generate the second pair of feedback voltage signals, $V_{OTAP}$ and $V_{OTAM}$;
   a reference current generator circuit configured to convert the second pair of feedback voltage signals, $V_{OTAP}$ and $V_{OTAM}$, into a pair of feedback reference current signals, $I_{BIAS0}$ and $I_{BIAS1}$; and
   a reference voltage generator circuit configured to convert the pair of reference current feedback signals, $I_{BIAS0}$ and $I_{BIAS1}$, into the first pair of feedback voltage signals, $V_{BIAS0}$ and $V_{BIAS1}$, and to feed the first pair of feedback voltage signals, $V_{BIAS0}$ and $V_{BIAS1}$, back to the first input terminals to cause current flowing in the first and second differential amplifiers to be steered in a such a way that a gain of the first and second differential amplifiers is controllably adjusted.

5. The transimpedance amplifier of claim 4, wherein the first differential amplifier comprises:
   a first transistor having a first current flowing through the first transistor between a first collector terminal of the first transistor and a first emitter terminal of the first transistor; and
   a second transistor having a second current flowing through the second transistor between a second collector terminal of the second transistor and a second emitter terminal of the second transistor, wherein the first and second emitter terminals are electrically shorted to the input current terminal such that a sum of the first current, the second current and the input current is substantially equal to a tail current flowing through the first tail current branch.

6. The transimpedance amplifier of claim 5, wherein the first transistor comprises a first base terminal and the second transistor comprises a second base terminal, and wherein the first and second base terminals are configured to receive the first pair of feedback voltage signals as inputs to the first differential amplifier.

7. The transimpedance amplifier of claim 4, wherein the first differential amplifier has a first lower compensation current receiving terminal that receives a first lower compensation current signal, and wherein the second differential amplifier has a second lower compensation current receiving terminal that receives a second lower compensation current signal.

8. The transimpedance amplifier of claim 7, wherein the first differential amplifier has a first upper compensation current receiving terminal that receives a first upper compensation current signal, and wherein the second differential amplifier has a second upper compensation current receiving terminal that receives a second upper compensation current signal.

9. The transimpedance amplifier of claim 8, further comprising a first current compensation circuit configured to generate the first and second lower compensation current signals and the first and second upper compensation current signals.

10. The transimpedance amplifier of claim 9, further comprising a second current compensation circuit configured to generate an additional first upper compensation current and an additional second upper compensation current that are coupled to the first and second upper compensation current receiving terminals, respectively.

11. The transimpedance amplifier of claim 10, wherein the first current compensation circuit is a bipolar transistor-based circuit, and the second current compensation circuit is a metal oxide semiconductor (MOS) transistor-based circuit.

12. The transimpedance amplifier of claim 8, further comprising a first resistor disposed between the first upper compensation current receiving terminal and the first lower compensation current receiving terminal.

13. The transimpedance amplifier of claim 12, further comprising a second resistor disposed between the second upper compensation current receiving terminal and the second lower compensation current receiving terminal, wherein the first and second resistors have the same resistance.

14. The transimpedance amplifier of claim 4, wherein the first differential amplifier comprises:
a first transistor having a first current flowing through the first transistor between a first collector terminal of the first transistor and a first emitter terminal of the first transistor, the first transistor having a first base terminal that acts as one of the first input terminals of the first differential amplifier; and
a second transistor having a second current flowing through the second transistor between a second collector terminal of the second transistor and a second emitter terminal of the second transistor, wherein the first and second emitter terminals are electrically shorted together, the second transistor having a second base terminal that acts as one of the first input terminals of the first differential amplifier.

15. The transimpedance amplifier of claim 14, wherein the first tail current branch includes a third transistor and a resistor, the third transistor having a third base terminal that is electrically coupled a second input terminal of the first differential amplifier for receiving an additional feedback voltage signal, the third transistor having a third emitter terminal that is electrically coupled to a first terminal of the resistor and to the input current terminal, the third transistor having a third collector terminal that is electrically coupled to the first and second emitter terminals of the first and second transistors, respectively, the resistor having a second terminal that is electrically coupled to ground.

16. The transimpedance amplifier of claim 15, wherein the reference voltage generator circuit, in addition to converting the pair of reference current feedback signals, $I_{BIAS0}$ and $I_{BIAS1}$, into the first pair of feedback voltage signals, $V_{BIAS0}$ and $V_{BIAS1}$, and feeding the first pair of feedback voltage signals, $V_{BIAS0}$ and $V_{BIAS1}$, back to the first input terminals, generates said additional feedback voltage signal and feeds said additional feedback voltage signal back to the second input terminal of the first differential amplifier.

17. A transimpedance amplifier having a gain that is adjusted via current steering, the transimpedance amplifier comprising:
a first differential amplifier having first and second bias voltage input terminals that are electrically coupled to first and second base terminals of first and second transistors, respectively, of the first differential amplifier, the first and second base terminals receiving first and second feedback voltage signals, the first and second transistors having first and second emitter terminals that are electrically coupled together and to a first tail current branch;
an input current terminal for receiving an input current signal generated by an optoelectronic detector, the input current terminal being electrically coupled to the first tail current branch;
a first voltage output terminal electrically coupled to the first differential amplifier for outputting a first output voltage signal;
a second differential amplifier having third and fourth bias voltage input terminals that are electrically coupled to third and fourth base terminals of third and fourth transistors, respectively, of the second differential amplifier, the third and fourth base terminals receiving the first and second feedback voltage signals, respectively, the third and fourth transistors having third and fourth emitter terminals that are electrically coupled together and to a second tail current branch;
a second voltage output terminal electrically coupled to the second differential amplifier for outputting a second output voltage signal, wherein the first and second voltage outputs are configured to form a differential output signal that is indicative of the input current; and
automatic gain control circuitry configured to control the first and second feedback voltage signals to steer current from the first transistor into the second transistor, and vice versa, to adjust a gain of the transimpedance amplifier.

18. The transimpedance amplifier of claim 17, wherein as the input current signal increases, the gain control circuitry decreases the first feedback voltage signal and increases the second feedback voltage signal to steer current away from the first transistor into the second transistor, thereby decreasing the gain of the transimpedance amplifier.

19. The transimpedance amplifier of claim 18, wherein as the input current signal decreases, the gain control circuitry increases the first feedback voltage signal and decreases the second feedback voltage signal to steer current away from the second transistor into the first transistor, thereby increasing the gain of the transimpedance amplifier.

20. The transimpedance amplifier of claim 19, further comprising:
current compensation circuitry electrically coupled to the first and second differential amplifiers and generating first and second compensation currents that are electrically coupled into the first and second differential amplifiers.

* * * * *